United States Patent [19]

Embree et al.

[11] Patent Number: 5,744,987
[45] Date of Patent: Apr. 28, 1998

[54] SIGNAL CONVERTER FOR REPRODUCING AUDIO SIGNALS RECORDED ON A FILM MEDIUM

[75] Inventors: Paul M. Embree, Irvine, Calif.; Milton L. Embree, Reading, Pa.

[73] Assignees: Sony Corporation, Tokyo, Japan; Sony Pictures Entertainment, Park Ridge; Lucent Technologies, Inc., Murray Hill, both of N.J.

[21] Appl. No.: 555,055

[22] Filed: Nov. 8, 1994

[51] Int. Cl.$^6$ .................................................. H01J 40/16
[52] U.S. Cl. ........................... 327/103; 327/514; 327/561
[58] Field of Search ............................. 327/103, 514, 327/515, 101, 108, 561

[56] References Cited

U.S. PATENT DOCUMENTS

| | | | |
|---|---|---|---|
| 3,706,844 | 12/1972 | Besier et al. | 178/7.2 |
| 4,179,713 | 12/1979 | Freudenschuss et al. | 360/27 |
| 4,599,715 | 7/1986 | Beard | 369/124 |
| 4,691,112 | 9/1987 | Wydler | 250/570 |
| 4,877,953 | 10/1989 | Yamamuro | 250/214 |
| 5,367,248 | 11/1994 | Lin | 323/312 |

*Primary Examiner*—Timothy P. Callahan
*Assistant Examiner*—T. T. Lam
*Attorney, Agent, or Firm*—Lise A. Rode, Esq.

[57] ABSTRACT

A device for providing a balanced input over a photoelectric cell used in a motion picture film projector and for providing an unbalanced output audio signal for driving subsequent elements in an audio reproduction unit connected to the motion picture film projector, wherein the reproduced output audio signal has an improved quality over that of a previously known transformer output signal. The circuit supplies an unbalanced voltage signal in response to a current generated by a photoelectric cell having at least a first and second terminal. The circuit includes: a current to voltage converter for receiving the current from the first terminal of the photoelectric cell and providing a first output voltage and a current return unit connected to the current to voltage converter for receiving the first output voltage and for providing a second output voltage and for providing a return current along the second terminal of the photoelectric cell. The circuit may also include a balanced to unbalanced voltage converter for receiving the first and second output voltages and for providing a third output voltage which is free of common mode signals, wherein the first and second output voltages comprise a balanced signal and the third output voltage comprises an unbalanced signal.

26 Claims, 4 Drawing Sheets

SIGNAL CONVERTER FOR REPRODUCING AUDIO SIGNALS RECORDED ON A FILM MEDIUM

BACKGROUND

1. Field of the Invention

This invention relates to the field of film media having audio soundtracks recorded thereon. More particularly, this invention relates to a signal converter used in the reproduction of analog audio signals optically recorded on a medium such as a motion picture film.

2. General Background

In a conventional motion picture film 5 such as shown in FIG. 1, the recording format has a large number of picture recording areas (frames) 10 arranged in a longitudinal recording direction; that is along the direction of film travel. Audio signals relating to the picture recording areas are recorded in the analog soundtrack areas (20L, 20R) alongside the picture recording areas and in the film running direction. Perforation areas 12 are disposed at the periphery of the motion picture film 5 for transporting the film 5 during projection. During playback, the picture and associated body of signals are thus played back simultaneously, and the audio signals are reproduced with conventional equipment.

In general, as seen with reference to FIG. 2a, during reproduction of the audio signals recorded on the motion picture film, the film is passed under a small slit-like aperture (not shown) disposed between a focused light source 52 and a photoelectric cell 54 which are encased in a film projection unit (not shown). The photoelectric cell 54 comprises a planar substrate having two top terminals 56, 58 and a bottom reference terminal 57 (FIG. 2b). The top terminal 56 is divided in the middle to provide for the separate reproduction of the left and right channels of the audio soundtrack. The reference terminal 57 is connected via a lead 62 to other components (not shown), and sections 58, 60 of the top terminal 56 are respectively connected via leads 64 and 66 to subsequent elements in the audio reproducing unit (not shown). Due to the encoding process, the audio signals have varying intensities, or widths of "whiteness", and therefore cause varying amounts of light to pass through the aperture to the photoelectric cell 54 below, depending upon the particular encoded sound signal. As the amount of light impinging on the photoelectric cell 54 increases, increased current is generated to drive the subsequent audio reproduction unit elements accordingly.

Referring to FIG. 3, a known transformer 70 is generally connected to receive the output signal from the photoelectric cell 54. (Similar transformers are connected across each terminal section 58 to reference terminal 57 and terminal section 60 to reference terminal 57, for separate reproduction of left and right audio channels. For simplicity, discussion will be limited to a transformer for reproduction of only one of the audio channels). This transformer 70 generally serves at least three purposes. First, because the conductor cables used to connect the photoelectric cell 54 with the various other elements in the film projection unit may extend through as much as 30' of conduit (FIG. 2c), the signal must pass through the 60 Hz magnetic fields generated by various components in the film projection unit such as motors and other moving parts. The transformer 70 is thus used to provide common mode rejection of this 60 Hz "hum", in order to ensure optimal signal clarity. Additionally, the transformer 70 is useful for maintaining a low impedance input across the photoelectric cell 54, which will ensure the photoelectric cell's linear operation. Furthermore, as the conductor wire is long and the signal from the photoelectric cell 54 weak, the transformer 70 is used to convert the balanced input current to an unbalanced voltage output to ensure an accurately reproduced signal. Lastly, as indicated above, the top terminal 56 of the photoelectric cell is divided in two sections to provide for the separation of the left and right audio channels during reproduction of the audio signals. However, as seen in FIG. 2b, each of the two portions of the top terminal share a common bottom reference terminal 57. It is important that no current flows between the scored halves—i.e., that the input be balanced—in order that there be no mixing of the left and right channel signals. The known transformer 70 provides a current path from terminal section 58 through transformer terminal 76 back through transformer terminal 74 to reference terminal 57 of photoelectric cell 54 (FIGS. 2b, 3). (Similarly, a transformer for the other audio channel provides a current path from terminal section 60 through that transformer's primary back to reference terminal 57 of photoelectric cell 54). Therefore, a complete and separate circuit path is provided for each the left and right signals.

Although the transformer 70 has generally achieved the aforementioned purposes, several other problems are introduced with its use. First, even with high quality transformers, the quality of the signal reproduced therefrom is generally lessened due to harmonic distortion generated by the transformer 70. Additionally, because of the magnetic field generated by the transformer 70, restraints are placed on the location of certain electronic elements proximal to the transformer 70, and shielding of same must be included. Finally, as transformer 70 is relatively large and costly, the size and overall cost of the audio reproducing device is increased.

It would be desirable, therefore, to provide a smaller, less expensive device which could provide a balanced input to an unbalanced output which is free of common mode signals, and, wherein the quality of the output signal from the device is improved over that of a transformer. Such device must provide full channel separation of the audio channels when used in a motion picture film projector having a dual photoelectric cell with a common terminal, such as shown in FIGS. 2a and 2b.

Accordingly, it is one object of the present invention to provide a device which may be connected to a dual photoelectric cell having a common terminal which is used in a motion picture film projector to provide a dual output audio signal having an improved quality over that of a previously known transformer output signal.

It is another object of the present invention to provide a device having a low impedance balanced current input which may be connected to a photoelectric cell used in a motion picture film projector to reproduce audio signals recorded on the motion picture film.

It is still another object of the invention to provide a device which is smaller and less expensive than a transformer which would provide a balanced input over a photoelectric cell used in a motion picture film projector and which would provide an output audio signal for driving subsequent elements in an audio reproduction unit connected to the motion picture film projector, wherein the reproduced output audio signal has an improved quality over that of a previously known transformer output signal.

These and other objects, advantages and features of the invention will become apparent to those skilled in the art upon consideration of the following description of the invention.

SUMMARY OF THE INVENTION

Therefore, in accordance with the objects of the invention, there is provided a circuit for supplying a voltage signal in response to a current generated by a photoelectric cell having at least a first and second terminal. The circuit includes: a current to voltage converter for receiving the current from the first terminal of the photoelectric cell and providing a first output voltage and a current return unit connected to the current to voltage converter for receiving the first output voltage and for providing a second output voltage and for providing a return current along the second terminal of the photoelectric cell. Additionally, a balanced to unbalanced voltage converter may be connected to receive the first and second output voltages and to provide a third output voltage, wherein the first and second output voltages comprise a balanced signal and the third output voltage comprises an unbalanced signal which is free of common mode signals.

The features of the invention believed to be novel are set forth with particularity in the appended claims. The invention itself, however, both as to organization and method of operation together with further objects and advantages thereof may be best understood by reference to the following description taken in conjunction with the accompanying drawings.

BRIEF DESCRIPTION OF THE DRAWINGS

FIG. 2b shows the photoelectric cell of FIG. 2a

DETAILED DESCRIPTION OF THE INVENTION

Figure 1:
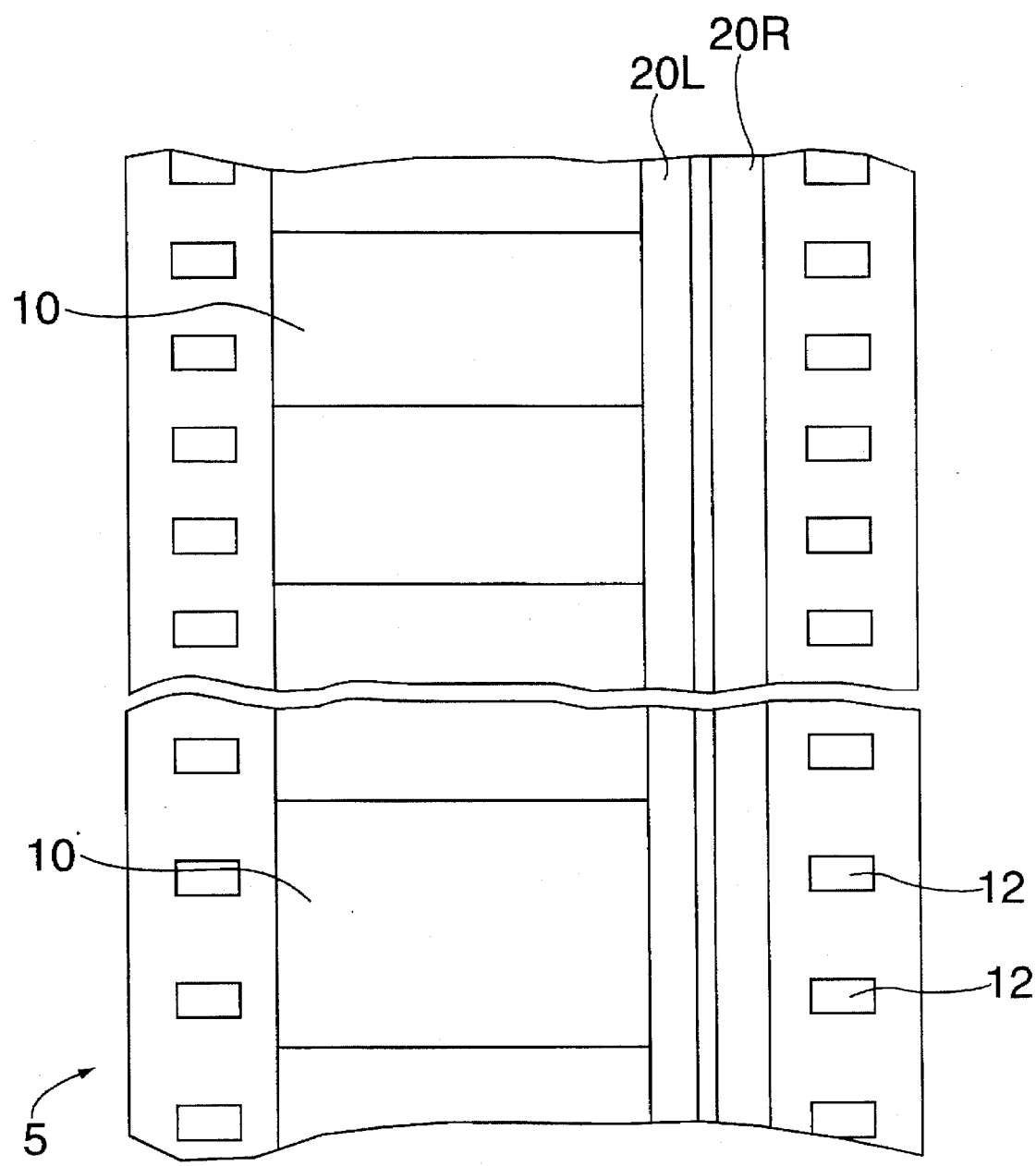
FIG. 1 shows a section of motion picture film having left and right audio soundtracks recorded thereon.

An embodiment of the device for providing a balanced input including equal return current to a photoelectric cell used in a motion picture film projector and for providing an unbalanced output audio signal for driving subsequent elements in an audio reproduction unit connected to the motion picture film projector will now be described in detail with reference to the accompanying drawings. It will be understood that the present disclosure is to be considered as an example of the present invention and is not intended to limit the invention to specific embodiments shown and described. In the following description, similar reference numbers are used to describe same, similar or corresponding parts in several views in the drawings.

Figure 4:
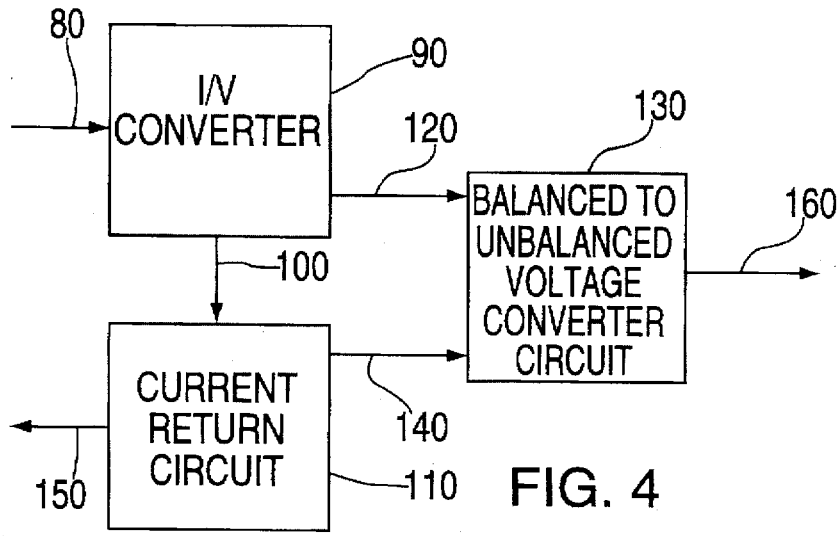
FIG. 4 shows a block diagram of a preferred embodiment of the signal converter of the present invention.

A block diagram of the signal converter of the present invention is shown in FIG. 4. (As with transformer 70, a separate signal converter is required for each the left and right audio channels, and thus for terminal sections 58 and 60. For simplicity, however, the signal converter of the present invention will only be discussed with respect to one of the two channels encoded on the motion picture film; e.g., the left channel and terminal section 58. It will be understood that a substantially similar device will be used to reproduce the right audio channel. It will also be understood that the designation of terminal section 58 as that section being associated with the left channel is arbitrary, and that this terminal section may instead be associated with reproduction of the right channel).

Figure 2A:
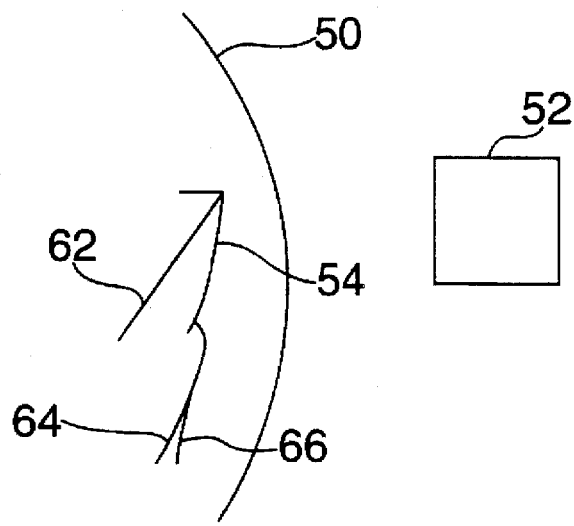
FIG. 2a shows the disposition of a motion picture film between a focused light source and a photoelectric cell during reproduction of the audio soundtracks recorded on the motion picture film.
Figure 2B:
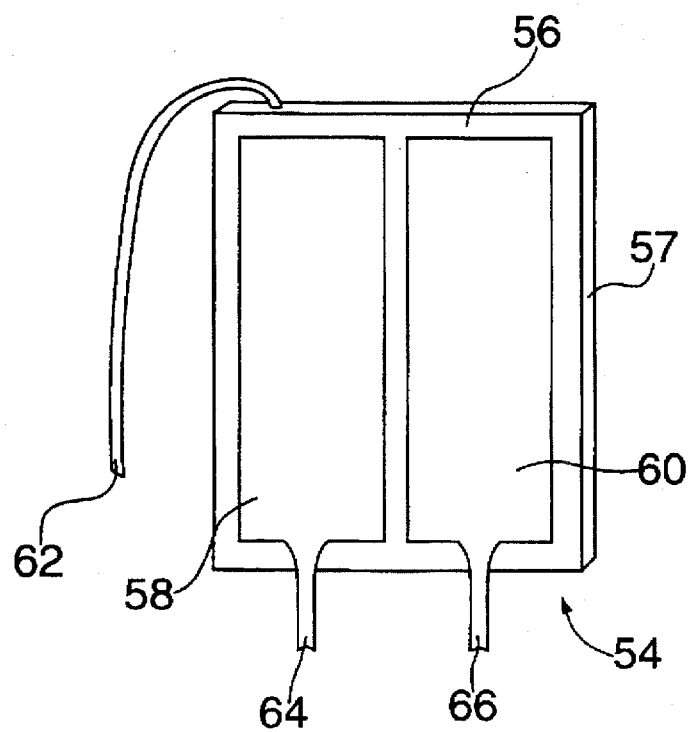

The positive output lead 64 of the photoelectric cell 54 is connected to provide an input 80 to a current to voltage converter unit 90. (FIGS. 2b, 4) (In the signal converter for the other encoded channel not discussed herein, the positive output lead 66 of the photoelectric cell 54 is connected to provide an input to a current to voltage converter unit similar to the current to voltage converter 90). One portion of the output from the current to voltage converter unit 90 is provided as an input 100 to a current return unit 110; another portion of the output of current to voltage converter unit 90 is provided as an input 120 to a balanced to unbalanced voltage converter unit 130. One portion of the output from current return unit 110 is then preferably provided as an input 140 to the balanced to unbalanced voltage converter unit 130; another portion of the output of the current return unit 110 is preferably provided as a return path 150 to the negative, or reference terminal 57, of photoelectric cell 54. Balanced to unbalanced voltage converter unit 130 receives balanced inputs 120 and 140 and provides an unbalanced output 160 which is free of common mode signals. (It will be understood that although in a preferred embodiment of the present invention the balanced to unbalanced converter unit 130 is connected to receive an input 120 from the voltage converter unit 90 and an input 140 from the current return unit 110 in order to provide an unbalanced output 160, such balanced to unbalanced converter unit 130 may be eliminated in those cases where it is desirable to provide a balanced output for driving subsequent circuitry).

In operation, the current to voltage converter unit 90 receives a current input 80 from photoelectric cell 54, converts this input to a voltage, and provides one portion of this output voltage as input 120 to the balanced to unbalanced voltage converter unit 130 and another portion of its output voltage as input 100 to the current return unit 110. The current return unit 110 receives input voltage 100 and provides a voltage output as input 140 to the balanced to unbalanced voltage converter unit 130. This output voltage of current return unit 110 is the inverse of the output voltage of current to voltage converter unit 90. Another portion of the output of current return unit 110 output is converted into a current and provided as 150 to the negative, or reference terminal 57, of photoelectric cell 54. As discussed with reference to the prior art transformer 70, this return path is necessary in order to provide a complete circuit path from the terminal section 58 (or terminal section 60 for the other audio channel) to the terminal section 57. The balanced to unbalanced voltage converter unit 130 receives the balanced input voltages 120, 140 and provides an unbalanced output voltage 160 for driving the subsequent elements in the audio reproducing unit (not shown). Importantly, the balanced to unbalanced voltage converter 130 eliminates common mode signals which may be present in the balanced input voltages 120 and 140, thus greatly improving the quality of the reproduced audio.

Figure 5:
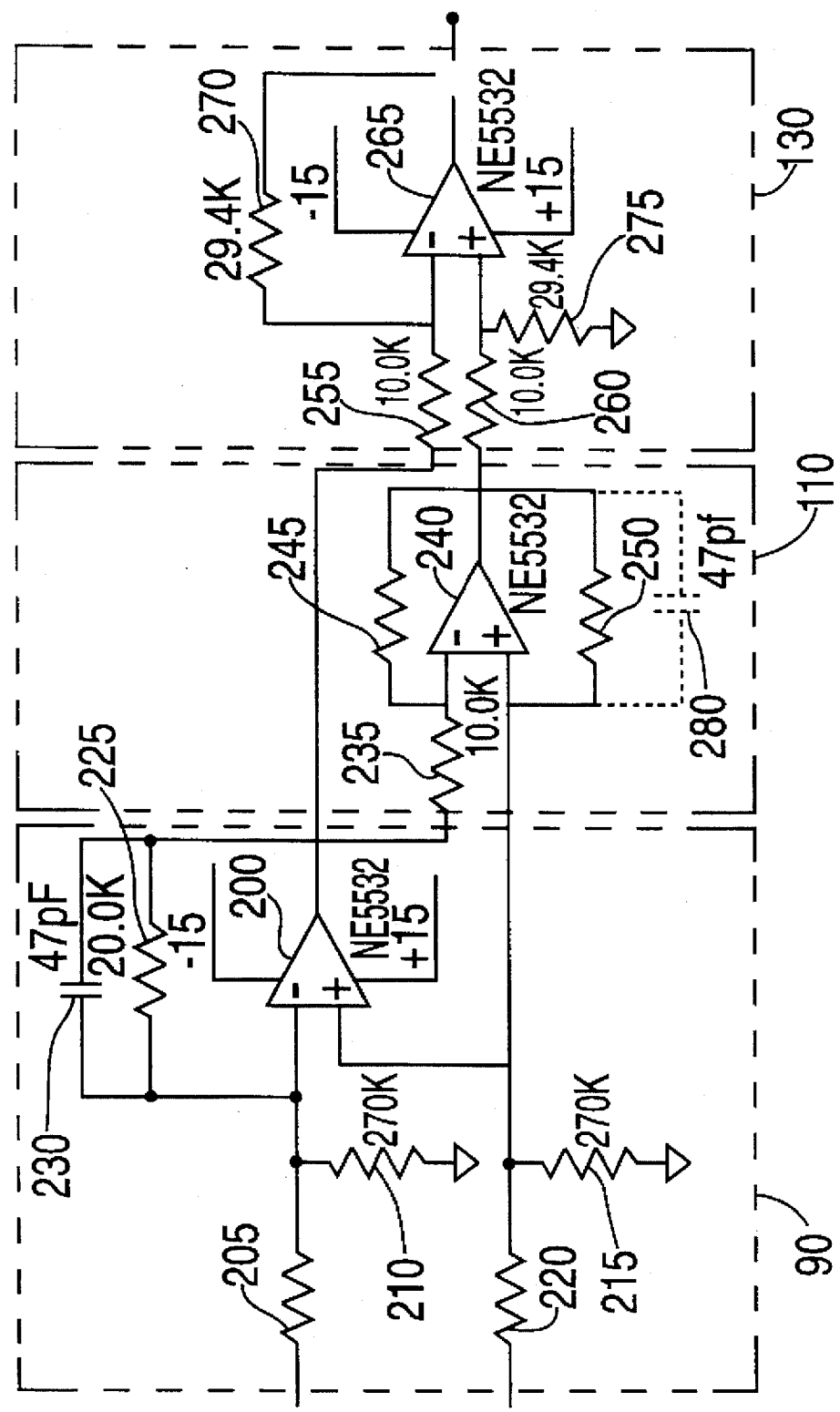
FIG. 5 shows a schematic of a preferred embodiment of the signal converter for one audio channel of the present invention.

FIG. 5 shows a more detailed description of the signal converter of the present invention. In the current to voltage converter unit 90, the section 58 of terminal 56 of the photoelectric cell 54 is connected to the negative terminal of an operational amplifier 200, preferably through resistor 205. (Resistor 205 is used to increase stability of the signal converter of the present invention. It will be understood that the presence of resistor 205 is not essential to the operation of the signal converter in the presence of the cable capacitance to ground of the present invention, and that it may be excluded from other embodiments thereof). A resistor 210 has a first terminal also connected to the negative terminal of an operational amplifier 200. The second terminal of resistor 210 is connected to ground. The positive terminal of operational amplifier 200 is connected to a first terminal of a second resistor 215, the second terminal of the resistor 215 also being connected to ground. The positive terminal of operational amplifier 200 is also preferably connected to a first terminal of resistor 220, the second terminal of which is connected to terminal 57 of photoelectric cell 54; again, however, it will be understood that the presence of resistor 220 is not essential to the operation of the signal converter of the present invention, and may be excluded.

A feed-back path is provided between the output of operational amplifier 200 and its negative terminal. The feedback path preferably comprises a resistor 225 in parallel with a capacitor 230. The output of operational amplifier 200 is connected to a first terminal of input resistor 235, the second terminal of input resistor 235 being connected to the negative terminal of an operational amplifier 240. The output of operational amplifier 240 is connected in a feedback arrangement to the its negative terminal via resistor 245. In addition, the output of operational amplifier 240 is also connected in a feedback arrangement to its positive terminal via a resistor 250. The resistor 250, and thus the positive terminal of operational amplifier 240, are connected to the positive terminal of operational amplifier 200 and thus the first terminal of resistor 215.

In one embodiment, the output of operational amplifier 200 and the output of operational amplifier 240 are respectively connected through resistor 255 to the negative terminal of differential operational amplifier 265, and through resistor 260 to the positive terminal of differential operational amplifier 265. The output of differential operational amplifier 265 is connected through a feedback resistor 270 to its negative terminal, and the positive terminal of differential operational amplifier 265 is connected to a first terminal of a resistor 275, the second terminal of which is connected to ground. Although FIG. 5 shows preferred values for each of the elements in the signal converter of the present invention, it will be understood that other values may be substituted, as known to those skilled in the art. Additionally, as stated previously, the balanced to unbalanced converter unit 130 may be eliminated in those cases where it is desirable to provide a balanced output for driving subsequent circuitry.

Figure 2C:
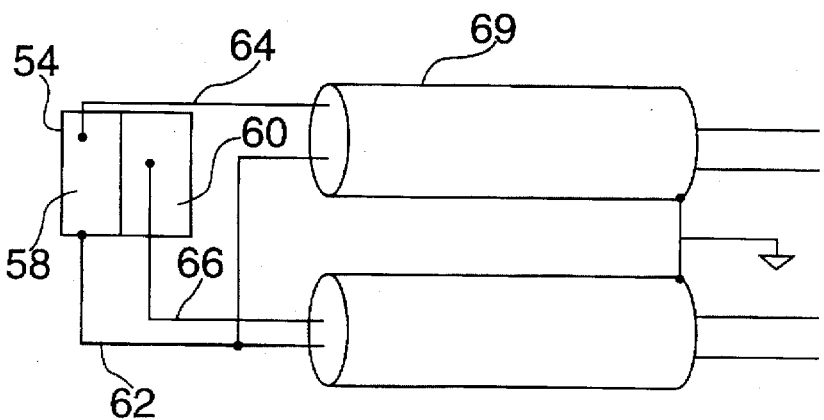
FIG. 2c shows the wiring used to connect the photoelectric cell of FIG. 2a to the signal converter of the present invention.

In operation, photoelectric cell 54 acts as a current source, and operational amplifier 200 acts as a current to voltage converter. The terminal section 58 of the photoelectric cell 54 is connected to provide a current input to operational amplifier 200 of the current to voltage converter unit 90. As no ground connection is made in the projector (FIG. 2c), resistors 210 and 215 are use to provide a DC reference voltage for operational amplifier 200, so that during operation, the operational amplifier 200 inputs and outputs do not float toward a non-linear region of the positive or negative power supply rails, which in FIG. 5 are respectively +15V and −15V. The presence of resistor 225 and capacitor 230 act as a low pass filter which rolls off at 6 dB/octave, and will be described in more detail with reference to discussion of the current return unit 110 neglecting common mode noise, the input current from the photoelectric cell 54 is output from operational amplifier 200 as a voltage, according to the following equation:

$$V_{200} = I_{54} * R_{225}$$

The output voltage from operational amplifier 200 is provided to the negative terminal of operational amplifier 240 of the current return unit 110, through a resistor 235. Operational amplifier 240 is a unity gain inverting amplifier, given the feedback path from the output to the negative terminal through resistor 245. Resistor 245 is chosen to have a value equal to that of resistor 235.

Figure 3:
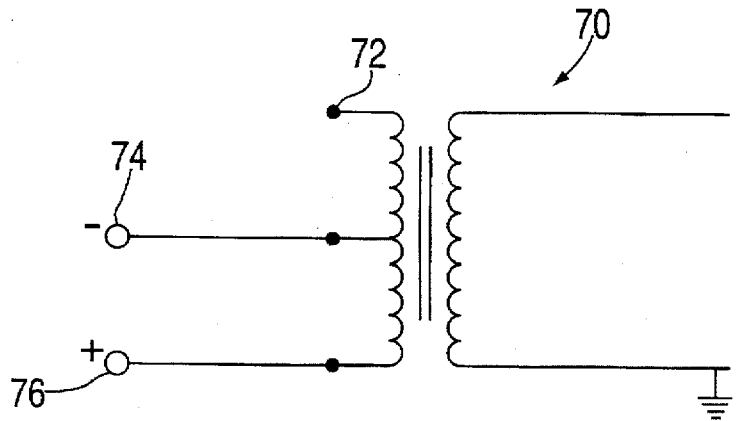
FIG. 3 is a schematic showing a known transformer 70 for use in providing an balanced input over a photoelectric cell used in a motion picture film projector, and for providing an unbalanced output signal for driving subsequent audio reproduction devices in the audio reproducing unit connected to the motion picture film projector.

As indicated previously, the transformer 70 of FIG. 3 has been used in the past, in part, to provide a balanced input for the photoelectric cell 54; and provide a return current to, and thus closed circuit over, the photoelectric cell 54. Ordinarily, an operational amplifier will not provide a return current through its feedback to other circuit elements. However, the feedback path introduced in the present invention, between the output of operational amplifier 240 through a resistor 250, introduces a return current path, as follows.

Referring again to FIG. 5, it will seen that the output of operational amplifier 240 is connected via resistor 250 to the positive terminal of both operational amplifier 200 and 240, as well as to the reference terminal 57 of photoelectric cell 54; preferably through resistor 220. As each of the operational amplifiers 200 and 240 has extremely high input impedances, it will be appreciated that minimal current will flow from the output of operational amplifier 240 back through the respective positive terminals of the operational amplifiers 200 and 240. Furthermore, equal capacitively-coupled common mode currents flow in resistors 210 and 215 resulting in equal common mode voltages at the inputs of both operational amplifiers 200 and 240. In addition, this common mode voltage is superimposed on the output voltages of operational amplifiers 200 and 240. Thus, it will be seen that the currents in resistors 225 and 250 will be equal and opposite in direction and the current flow through resistor 220 back to the reference terminal 57 of photoelectric cell 54 will be equal to the current flowing from photoelectric cell 54 through resistor 205 to the input of current to voltage converter 90.

Now, in accordance with the signal converter of the present invention, resistor 225 of the current to voltage converter unit 90 is made equivalent to resistor 250 of the current return unit 110 in order that the currents through each of these resistors be equivalent. Similarly, resistors 235 and 245 are made equivalent so the signal voltage at the output of operational amplifier 240 will be the negative of that at the output of operational amplifier 200. Therefore, as the return current from the output of the operational amplifier 240 back to the reference terminal 57 of photoelectric cell 54 is equivalent to the current through the feedback path of operational amplifier 200, and thus the current through resistor 205 and terminal section 58 of photoelectric cell 54, a complete circuit is formed from terminal section 58 back to reference terminal 57. Again, a similarly configured complete circuit is maintained between terminal section 60 and reference terminal 57. Thus two complete circuits are formed, a balanced input is created, the effects of common mode currents are canceled and there will be minimal crosstalk between audio channels.

Ordinarily, a circuit in which there existed two operational amplifiers in series, having unity gain, one of said which has a positive feedback path, would result in the unstable operation of both operational amplifiers, particularly at high frequencies. However, the presence of capacitor 230 in the current to voltage converter unit 90 serves to stabilize their operation, by improving the phase margin of the feedback arrangement created by the feedback paths of operational amplifiers 200 and 240 and attenuating high frequency signals in particular. Although a 47 pF capacitor is preferably used with the NE5532 operational amplifier (FIG. 5) supplied by such companies as Texas Instruments, capacitors of other values may be used as known to those skilled in the art. However, it is preferred that the value of capacitor 230 be small enough to avoid excessive roll-off in frequency response of the operational amplifier 200. In another embodiment of the present invention, another capacitor 280 of equal value (shown in dashed lines) may be placed in parallel across resistor 250. The capacitor 280 improves the cross-talk between channels at high frequencies because the returned current will be the same amplitude and phase as the input current to the operation amplifier 200 even at high frequencies.

As seen in FIG. 5, the output voltage of operational amplifier 200 is supplied to the negative terminal of operational amplifier 265 of the balanced to unbalanced voltage converter unit 130, while the output of operational amplifier 240 is supplied to the positive terminal of operational amplifier 265. It will be appreciated from the above equations that the output voltage signal of operational amplifier 200 is the inverse of the output voltage signal operational amplifier 240. Operational amplifier 265, which is a differential amplifier, produces an output voltage which is the difference between the output voltages of operational amplifiers 200 and 240. The output voltage of operational amplifier 265 is therefore defined as:

$$V_{OUT} = R_F/R_1 * (V_2 - V_1);$$

where $R_F$ is the value of feedback resistor 270, $R_1$ is the value of resistor 255, $V_2$ is the value of the output voltage of operational amplifier 240, and $V_1$ is the value of the output voltage of operational amplifier 200. In the embodiment shown, resistor 270 has a value of 29.4 kilo-ohms, and resistor 255 has a value of 10 kilo-ohms. Therefore, $$V_{OUT} = 2.94 * (V_2 - V_1).$$

Further, as the voltage at the positive terminal of operational amplifier 265 is near to ground, the output, $V_{OUT}$, of operational amplifier 265 is an unbalanced signal, with any common mode voltage removed. Again it is important that the output signal not contain any common mode components, because the signal from the photoelectric cell 54 tends to be rather weak and is supplied along a lengthy conductor (FIG. 2c), and thus may pick up large common-mode signals, such as the aforementioned 60 Hz "hum".

It will therefore be appreciated that the above-described signal converter is a smaller and less expensive device than a transformer 70, yet provides the desired balanced input over a photoelectric cell used in a motion picture film projector and output audio signal for driving subsequent elements in an audio reproduction unit. The signal converter of the present invention further provides a reproduced output audio signal free of common mode signals and which has an improved quality over that of a previously known transformer output signal.

It is further apparent that in accordance with the present invention an embodiment that fully satisfies the objectives, aims, and advantages is set forth above. While the invention has been described in conjunction with specific embodiments, it is evident that many alternatives, modifications, permutations, and variations, will become apparent to those skilled in the art in light of the foregoing description. For example, as stated above, although in a preferred embodiment of the present invention the balanced to unbalanced converter unit 130 is connected to receive an input 120 from the voltage converter unit 90 and an input 140 from the current return unit 110 in order to provide an unbalanced output 160, such balanced to unbalanced converter unit 130 may be eliminated in those cases where it is desirable to provide a balanced output for driving subsequent circuitry.

Other embodiments will occur to those skilled in the art. Accordingly, it is intended that the present invention embrace all such alternatives, modifications, and variations as fall within the scope of the appended claims.

What is claimed is:

1. An electronic circuit for providing a voltage signal in response to a current generated by a photoelectric cell having at least a first and second terminal, comprising:

current to voltage converter means for receiving said current from said first terminal of said photoelectric cell and providing a first output voltage; and, current return means connected to said current to voltage converter means for receiving said first output voltage and for providing a return current to said second terminal of said photoelectric cell.

2. The electronic circuit of claim 1, wherein said current return means provides a second output voltage.

3. The electronic circuit of claim 2, further comprising:

balanced to unbalanced voltage converter means for receiving said first and second output voltages and for providing a third output voltage, wherein said first and second output voltages comprise a balanced signal and said third output voltage comprises an unbalanced signal.

4. The electronic circuit of claim 2 wherein said first output voltage of said current to voltage converter means comprises the inverse of said second output voltage of said current return means.

5. The electronic circuit of claim 3, wherein said balanced to unbalanced voltage converter means comprises a differential operational amplifier.

6. The electronic circuit of claim 5, wherein said differential operational amplifier has an output and first and second terminals, said first output voltage of said current to voltage converter means being applied to said first terminal, and said second output voltage of said current return means being applied to said second terminal, and wherein said output of said differential operational amplifier comprises said unbalanced signal.

7. The electronic circuit of claim 1, wherein said current to voltage converter means comprises a first operational amplifier.

8. The electronic circuit of claim 1, wherein said current to voltage converter means comprises:

a first operational amplifier having an output and first and second terminals, wherein said output is connected to said first terminal in a feedback arrangement.

9. The electronic circuit of claim 8, wherein said current to voltage converter means further comprises a first resistor, a first terminal of which is connected to said first terminal of said first operational amplifier, and a second resistor, a first terminal of which is connected to said second terminal of said first operational amplifier.

10. The electronic circuit of claim 9, wherein said first and second resistors have the same values.

11. The electronic circuit of claim 9, wherein said first and second resistors each have second terminals connected to ground.

12. The electronic circuit of claim 8, wherein said feedback arrangement comprises a resistor connected in parallel with a capacitor.

13. The electronic circuit of claim 12, wherein said capacitor has a value from 20–70 picofarads.

14. The electronic circuit of claim 1, wherein said current return means comprises an operational amplifier having an output and first and second terminals, and further having a first and second feedback path respectively between said output and said first and second terminals.

15. The electronic circuit of claim 14, wherein said first and second feedback paths respectively comprise first and second resistors.

16. The electronic circuit of claim 1, wherein:

said current to voltage converter means comprises a first operational amplifier having an output and first and second terminals, said output being connected to said first terminal via a feedback path, wherein said feedback path comprises a first resistor and a first capacitor in parallel with said first resistor, and wherein said second terminal of said first operational amplifier is connected to said second terminal of said photoelectric cell; and, said current return means comprises a second operational amplifier having an output and first and second terminals, and further having a first and second feedback path respectively between said output and said first and second terminals, wherein said second terminal of said second operational amplifier is connected to said second terminal of said photoelectric cell to provide said return current through said second feedback path back to said photoelectric cell.

17. The electronic circuit of claim 16, wherein said second feedback path comprises a second resistor.

18. The electronic circuit of claim 16, wherein said second feedback path further comprises a second capacitor connected in parallel with said second resistor.

19. The electronic circuit of claim 16, wherein said first capacitor has a value from 20 to 70 picofarads.

20. The electronic circuit of claim 17, wherein said first resistor of said current to voltage converter means and said second resistor of said current return means have the same value.

21. The electronic circuit of claim 18, wherein said first capacitor of said second feedback path of said current return means and said second capacitor of said feedback path of said current to voltage converter means have the same value.

22. An electronic circuit for providing a voltage signal in response to a current generated by a photoelectric cell having at least a first and second terminal, comprising:

a current to voltage converter for receiving said current from said first terminal of said photoelectric cell and providing a first output voltage; and, a current return device connected to said current to voltage converter means for receiving said first output voltage and for providing a return current to said second terminal of said photoelectric cell.

23. The electronic circuit of claim 21, wherein said current return means provides a second output voltage.

24. The electronic circuit of claim 23, wherein each of said first and second output voltages includes common mode signals, said circuit further comprising:

a balanced to unbalanced voltage converter for receiving said first and second output voltages and for providing a third output voltage, wherein said first and second output voltages comprise a balanced signal and said third output voltage comprises an unbalanced signal which is free of said common mode signals.

25. A circuit for providing a voltage signal in response to a current generated by a photoelectric cell having at least a first and second terminal, comprising:

a current to voltage converter including a first operational amplifier, said current to voltage converter for receiving said current from said first terminal of said photoelectric cell and providing a first output voltage; and, a current return device including a second operational amplifier, said current return device connected to said current to voltage converter means for receiving said first output voltage and for providing a return current to said second terminal of said photoelectric cell and a second output voltage; and, a balanced to unbalanced voltage converter for receiving said first and second output voltages and for providing a third output voltage, wherein said first and second output voltages comprise a balanced signal and said third output voltage comprises an unbalanced signal.

26. The electronic circuit of claim 25, wherein each of said first and second output voltages includes common mode signals, and wherein said unbalanced signal is free of said common mode signals.

* * * * *